(12) United States Patent  
Kobayashi et al.

(10) Patent No.: US 8,629,347 B2  
(45) Date of Patent: Jan. 14, 2014

(54) PHOTOVOLTAIC CELLS BASED ON NANOSCALE STRUCTURES

(71) Applicants: Nobuhiko P. Kobayashi, Sunnyvale, CA (US); Achyut K. Dutta, Sunnyvale, CA (US)

(72) Inventors: Nobuhiko P. Kobayashi, Sunnyvale, CA (US); Achyut K. Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 0 days.

(21) Appl. No.: 13/632,076

(22) Filed: Sep. 30, 2012

(65) Prior Publication Data

US 2013/0042909 A1     Feb. 21, 2013

Related U.S. Application Data

(62) Division of application No. 11/161,840, filed on Aug. 18, 2005, now Pat. No. 8,309,843.

(51) Int. Cl.
*H01L 31/04* (2006.01)

(52) U.S. Cl.
USPC ........... 136/256; 136/255; 136/252; 136/260; 136/262; 257/53; 257/81; 257/94; 257/95; 257/101; 257/102; 257/E31.032; 257/E31.039; 257/E31.04; 438/57; 438/63; 438/86; 438/94; 438/95; 438/98

(58) Field of Classification Search
USPC ............ 136/256, 255, 252, 260, 262; 257/53, 257/81, 94, 95, 101, 102, 103, E31.032, 257/E31.039, E31.04; 438/57, 63, 86, 94, 438/95, 98
See application file for complete search history.

(56) References Cited

U.S. PATENT DOCUMENTS

| | | | |
|---|---|---|---|
| 2002/0130311 A1* | 9/2002 | Lieber et al. | 257/1 |
| 2002/0172820 A1* | 11/2002 | Majumdar et al. | 428/357 |
| 2002/0192441 A1* | 12/2002 | Kalkan et al. | 428/209 |
| 2003/0089899 A1* | 5/2003 | Lieber et al. | 257/9 |
| 2004/0003839 A1* | 1/2004 | Curtin | 136/250 |
| 2004/0109666 A1* | 6/2004 | Kim, II | 385/147 |
| 2004/0118448 A1* | 6/2004 | Scher et al. | 136/252 |
| 2005/0126628 A1* | 6/2005 | Scher et al. | 136/263 |
| 2006/0207647 A1* | 9/2006 | Tsakalakos et al. | 136/256 |

* cited by examiner

*Primary Examiner* — Golam Mowla (57) ABSTRACT

Novel structures of photovoltaic cells (also known as solar cells) are provided. The Cells are based on the nanometer-scaled wire, tubes, and/or rods, which are made of the electronics materials covering semiconductors, insulator or metallic in structure. These photovoltaic cells have large power generation capability per unit physical area over the conventional cells. These cells can have also high radiation tolerant capability. These cells will have enormous applications such as in space, in commercial, residential and industrial applications.

20 Claims, 7 Drawing Sheets

FIG. 8

PHOTOVOLTAIC CELLS BASED ON NANOSCALE STRUCTURES

PARENT CASE TEXT

This is a divisional of application(s) Ser. No. 11/161,840 filed on Aug. 18, 2005.

CROSS REFERENCE TO RELATED APPLICATIONS

This application claims the benefits of U.S. Provisional Application No. 60/522,134 filed Aug. 19, 2004.

FIELD OF INVENTIONS

This patent specification relates to structures of photovoltaic cells (also solar cells). More specifically, it relates to structures of photovoltaic cells comprising numerous nanometer-scale wires, rods and/or tubes to have large power generation capability per unit area. The photovoltaic cells have also highly radiant tolerant, necessary for space applications. These photovoltaic cells can be used in commercial, residential, and also industrial application for power generation.

BACKGROUND OF THE INVENTIONS

Photovoltaic cells where light is converted into electric power to be fed to external loads electrically connected to the photovoltaic cells have been prevailing in a wide range of application fields such as consumer electronics, industrial electronics and space exploration. In consumer electronics, photovoltaic cells that consist of materials such as amorphous silicon are choices for a variety of inexpensive and low power applications. Typical conversion efficiency, i.e. the solar cell conversion efficiency, of amorphous silicon based photovoltaic cells ranges between ~10% [Yamamoto K, Yoshimi M, Suzuki T, Tawada Y, Okamoto T, Nakajima A. *Thin film poly-Si solar cell on glass substrate fabricated at low temperature*. Presented at MRS Spring Meeting, San Francisco, April 1998.]. Although the fabrication processes of amorphous silicon based photovoltaic cells are rather simple and inexpensive, one notable downside of this type of cell is its vulnerability to defect-induced degradation that decreases its conversion efficiency.

In contrast, for more demanding applications such as industrial solar power generation systems, either poly-crystalline or single-crystalline silicon is the choice because of more stringent requirements for better reliability and higher efficiency than the applications in consumer electronics. Photovoltaic cells consisting of poly-crystalline and single-crystalline silicon generally offer the conversion efficiency ranging ~20% and ~25% [Zhao J, Wang A, Green M, Ferrazza F. *Novel 19.8% efficient 'honeycomb' textured multicrystalline and 24.4% monocrystalline silicon solar cell. Applied Physics Letters* 1998; 73: 1991-1993.] respectively. As many concerns associated with a steep increase in the amount of the worldwide energy consumption are raised, further development in industrial solar power generation systems has been recognized as a main focus.

Group II-VI compound semiconductors, for example CdTe and CdS, have been investigated in the context of having industrial solar power generation systems manufactured at a lower cost with maintaining a moderate conversion efficiency, resulted in a comparable conversion efficiency ~17% [Wu X, Keane J C, Dhere R G, DeHart C, Duda A, Gessert T A, Asher S, Levi D H, Sheldon P. *16_5%-efficient CdS/CdTe polycrystalline thin-film solar cell. Proceedings of the 17th European Photovoltaic Solar Energy Conference*, Munich, 22-26 October 2001; 995-1000.] to those for the single crystalline silicon photovoltaic devises, however toxic natures of these materials are of great concerns for environment.

Group I-III-VI compound semiconductors, such as $CuInGaSe_2$, have been also extensively investigated for industrial solar power generation systems. This material can be synthesized potentially at a much lower cost than its counterpart, single crystalline silicon, however conversion efficiency, ~19%, comparable to that of single crystalline silicon based cells can be obtained, so far, by only combining with the group II-VI compound semiconductor cells [Contreras M A, Egaas B, Ramanathan K, Hiltner J, Swartzlander A, Hasoon F, Noufi R. *Progress toward 20% efficiency in Cu(In,Ga)Se polycrystalline thin-film solar cell. Progress in Photovoltaics: Research and Applications* 1999; 7: 311-316.], which again raise issues associated with toxic natures of these materials.

A type of photovoltaic cells designed for several exclusive applications where the main focus is high conversion efficiency generally consists of group III-V semiconductors including GaInP and GaAs. Synthesis processes of single crystalline group III-V are in general very costly because of substantial complications involved in epitaxial growth of group III-V single crystalline compound semiconductors. Typical conversion efficiency of group III-V compound semiconductor based photovoltaic cells, as these types of photovoltaic cells are intended to be, can be as high as ~34% when combined with germanium substrates, another very expensive material [King R R, Fetzer C M, Colter P C, Edmondson K M, Law D C, Stavrides A P, Yoon H, Kinsey G S, Cotal H L, Ermer J H, Sherif R A, Karam N H. *Lattice-matched and metamorphic GaInP/GaInAs/Ge concentrator solar cells. Proceedings of the World Conference on Photovoltaic Energy Conversion (WCPEC-3)*, Osaka, May 2003; to be published.].

Figure 1:
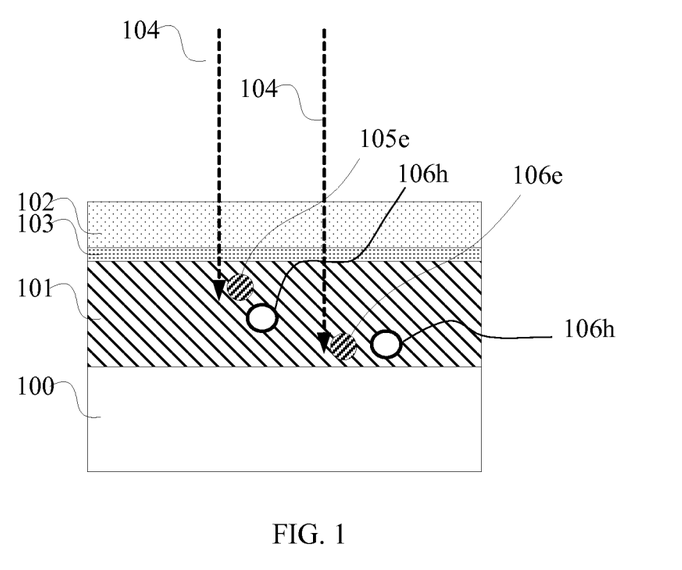
FIG. 1 is the schematic showing the cross-sectional view of a conventional photovoltaic cell structure. This is the explanatory diagram showing the prior-art of today's photovoltaic cell.

All types of photovoltaic cells in the prior arts described above, no matter what materials a cell is made of, essentially falls into one specific type of structure as in FIG. 1. Shown in FIG. 1 is a photovoltaic cell comprising a thick p-type semiconductor layer 101 and a thin n-type semiconductor layer 102 formed on an electrically conductive substrate 100. A pn-junction 103 is formed at the interface between the p-type semiconductor layer 101 and the n-type semiconductor layer 102. Incident light 104 entering the cell generate electron-hole pairs after being absorbed by the p- and also n-type semiconductor layers 101 and 102. The incident light generates electrons 105$e$ and also holes 105$h$ in the region near the pn-junction 103 and also 106$e$ and 106$h$ in the region far from the pn-junction 103. The photo generated electrons (and holes) 105$e$ and 106$e$ (hereafter considering only electronics, i.e. minority carriers in p-type semiconductors, and the same explanation is applicable for holes, minority carriers in n-type semiconductors, also) diffusing toward the pn-junction 103 and entering the pn-junction 103 contribute to photovoltaic effect. This is also vice versa for the holes, existing as minority carriers in n-type semiconductor 102. The two key factors that substantially impact the conversion efficiency of this type of photovoltaic cell are photo carrier generation efficiency (PCGE) and photo carrier collection efficiency (PCCE).

The PCGE is the percentage of the number of photons entering a cell and contributing to the generation of photo carriers, which needs to be, ideally, as close as ~100%. On the other hand, the PCCE is the percentage of the number of photo-generated electrons 105$e$ and 106$e$ reaching the pn-junction 103 and contributing to the generation of photocurrent. For a monochromatic light, the PCGE of ~100% can be achieved by simply making the p-type layer 101 thicker, however, electrons 106e generated at the region far away from the pn-junction 103 cannot be collected efficiently due to many adverse recombination processes that prevent photo generated carriers from diffusing into the pn-junction 103, thus the basic structure of current photovoltaic cells has its own limitation on increasing the conversion efficiency. Both PCGE and PCCE are mainly dependent on material and structure of the photovoltaic cells, and today's photovoltaic cells are structured in such a way that (a) wide ranges of solar spectrum cannot be absorbed due to its material limitation, and (b) photo carrier's collection efficiency is lower due to its inherent structure. Besides, today's solar cell material is not highly radiation-tolerant. In space application specially, photovoltaic cells should have a structure and material systems, which could generate high-power per unit area and also to highly radiation tolerant.

For both commercial and space applications, therefore, it would be desirable to have photovoltaic cell structures where both the PCGE and the PCCE can be increased simultaneously by having a photo absorption region that is thick enough to capture all the photons entering the cell and a pn-junction that is located at as close to the photo absorption region as possible. It would be further desirable to have, with maintaining ideal PCGE and PCCE, different materials having photo responses at different spectrum to efficiently cover a wide range of spectrum of light that enters a photovoltaic cell. It would be further desirable to have a large junction area within a given volume of a photovoltaic cell so that generated electric power that is proportional to the junction area can be maximized.

BRIEF SUMMARY OF THE INVENTION

Accordingly, it is an object of the invention to provide the structures of the photovoltaic cells, which could have the high power generation capability per unit area over conventional counterpart, mentioned as the prior arts.

According to this invention, the photovoltaic cell can be made to highly radiation tolerant.

Structures of photovoltaic cells comprising single or plurality of nanometer(s)-scale wires, rods or tubes consisting of various electronic materials are described. The surfaces of the nanometer(s)-scale wires, rods or tubes formed on a supporting substrate are connected to another electronic material or several different electronic materials, forming a large area of pn- or Schottky junctions on the surfaces of the nanometer(s)-scale wires, rods or tubes. The created large area pn- or Schottky junctions on the surface of the plurality of nanometer(s)-scale wires, rods or tubes form built-in potential by which photo generated electrons and holes are swept away, leading to photovoltaic effect.

According to this invention, the nanometers-scaled wires, rods or tubes are made of electronic materials such as semiconductors, insulator or metals, or their combination, and they are formed on base substrates with geometries in which the axial direction of nanometers-scaled wires, rods or tubes are either in perpendicular or parallel with respect to the surface normal of the base substrates. According to this invention, the nanometer-scaled wires, rods or tubes could be made of any types, elementary or compound, of semiconductors such as Si, Ge, C, ZnO, BN, $Al_2O_3$, AlN, Si:Ge, CuInSe, II-VI and III-V, etc., or their combinations. The nanometer(s)-scaled tube could be made of semiconductor, insulator, or metallic type tubes such as carbon nano-tubes.

It is also another object of this invention to provide the structures of the photovoltaic cells based on the carbon-nano-tubes or semiconductor wires or rods which could provide more junction area per unit physical area, which results in increasing the power generation per unit area over conventional photovoltaic cells.

This invention offers to generate power 100 times per unit area ad beyond over conventional photovoltaic cells. Also, the proposed photovoltaic cells are highly radiation tolerant, necessary in the space application. The main advantages of these inventions are that today's highly matured semiconductor process technologies can be used to fabricate the photovoltaic cell which has the power generation capability a few order and beyond as compared with that of conventional photovoltaic cell.

Other objects, features, and advantages of the present invention will be apparent from the accompanying drawings and from the detailed description that follows below.

BRIEF DESCRIPTION OF THE DRAWINGS

The invention will be explained in more detail in conjunction with the appended drawings wherein.

DETAILED DESCRIPTION

Figure 2:
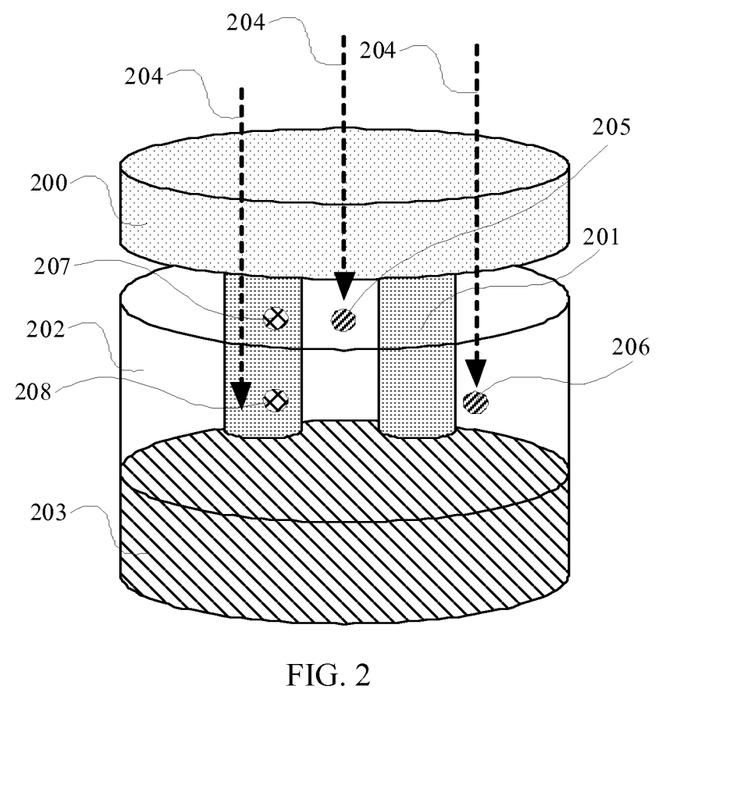
FIG. 2 is the schematic showing the cross-sectional view of a photovoltaic cell structure consisting of the nanometer(s)-scale wires, or rods, vertically arranged, in the first embodiment in accordance to the present invention.

According to a preferred embodiment illustrated in FIG. 2, shown is a photovoltaic cell comprising plurality of nanometer(s)-scale wires or rods 201 electrically connected to an electrode 200. The nanometer(s)-scale wires or rods 201 can have metallic electrical conduction, p-type or n-type semiconductor electrical conduction. The nanometer(s)-scale wires or rods are further surrounded by an electronic material 202 having metallic electrical conduction, p-type or n-type semiconductor electrical conduction. The electronic material 202 is further electrically connected to an electrode 203. The electrode 200 has direct electrical contact to neither the electrical material 202 nor the electrode 203. As described above, the electrode 200 is intended to serve as a common electrode that connects all wires or rods 201. The electrode 203 is provided for the electronic material 202. The interface between the nanometer scale wires or rods 201 and the electronic material 202 form pn- or Schottky junctions where built-in potential for both electrons and holes is generated.

According to this invention, alternatively the nanometer(s)-scale wires or rods 201 can be formed on separate substrate (not shown here), and the electrode 203 can be formed on the substrate to have common contact for each nanometer(s)-scale rods or tubes 201, necessary for creating junction. In way of an example not way of limitation, the nanometer(s)-scale wires or rods 201 can be made of n-type semiconductor and the electric material 202 that surrounds the nanometer(s)-scale wires or rods 201 can be made of p-type semiconductor. Incident light 204 enters the photovoltaic cell through either the electrode 203 or the electrode 200 (In FIG. 2, the incident light enters the photovoltaic cell through the electrode 200). As the incident light 204 travels through the electronic material 202, a numerous number of electrons 205 in the region near the electrode 200 and electrons 206 in the region far from the electrode 200 are generated. It should be pointed out that electrons are apparently generated all over the region along the thickness of the electric material 202. In addition, as the incident light 204 travels through the nanometer(s)-scale wires or rods 201, a numerous number of holes 207 in the region near the electrode 200 and holes 208 in the region far from the electrode 200 are generated. It also should be pointed out that holes are apparently generated all over the region along the thickness of the nanometer(s)-scale wires or rods 201. Photo-generated electrons 205 and 206 in the electronic material 202 made of p-type semiconductor and photo-generated holes 207 and 208 in the nanometer(s)-scale wires or rods 201 made of n-type semiconductor, then diffuse toward pn-junctions, created at the interface between the nanometer(s)-scale wires rods 201 and the electronic material 202. At the pn-junctions, the electrons and the holes are swept away by built-in potential, thus photovoltaic effects set in.

Apparent advantage of this invention over conventional photovoltaic cells is directly associated with the fact that, unlike conventional photovoltaic cells, pn-junctions are almost parallel to the direction to which incident light 204 travels, i.e., for all photo generated carriers in the electronic material 202, no matter where they are generated, the distance the photo generated carriers have to diffuse to reach the pn-junctions is within the range of the distance between two nanometer(s)-scale wires or rods existing next to each other and independent to the location where they are generated. Furthermore, for all photo generated carriers in the nanometer(s)-scale wires or rods 201, no matter where they are generated, the distance the photo generated carriers have to diffuse to reach pn-junctions is within the range of the diameter of the nanometer(s)-scale rods 201. On the other hand, as explained in the description for the prior art shown in FIG. 1, in conventional photovoltaic cells where pn-junctions are perpendicular to the direction to which incident light travels, the photo generated carriers generated in region far away from pn-junctions need to diffuse much longer distance (diffusion-length) than that for the photo generated carriers generated near the pn-junctions, thus they have a greater chance to recombine without contributing to photovoltaic effects. Therefore in this invention, PCCE is expected to be much higher than that in conventional photovoltaic cells. In addition, it is evident that the total effective area that contributes to photovoltaic effect in this invention can be increased by 25 times and beyond for a given cell size with realistic assumptions on the dimension of the nanometer(s)-scale structures in the cell.

Figure 3:
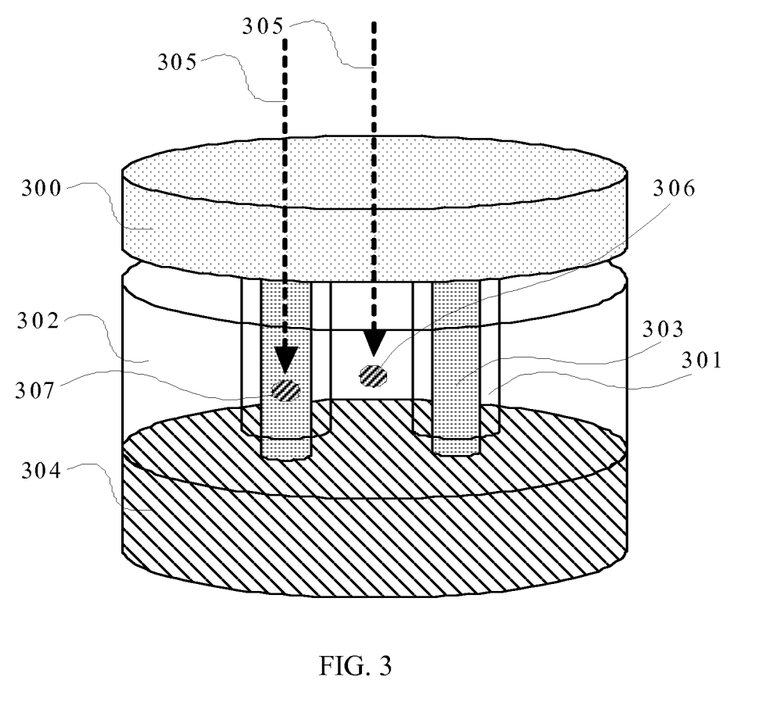
FIG. 3 is the schematic showing the cross-sectional view of a photovoltaic cell structure consisting of the nanometer(s)-scale tubes vertically arranged, in the second embodiment in accordance to the present invention.

In an alternative preferred embodiment shown in FIG. 3, a photovoltaic cell comprises plurality of nanometer(s)-scale tubes 301 are electrically connected to an electrode 300. The nanometer(s)-scale tubes 301 can have metallic electrical conduction, p-type or n-type semiconductor electrical conduction. The nanometer(s)-scale tubes are further surrounded by an electronic material 302 having metallic electrical conduction, p-type or n-type semiconductor electrical conduction. The inside of the nanometer(s)-scale tubes 301 can be either empty or filled up with an electronic material 303 having metallic electrical conduction, p-type or n-type semiconductor electrical conduction. Two electronic materials 302 and 303 are further electrically connected to an electrode 304. The electrode 304 has direct electrical contact to neither the electrode 300 nor the nanometer(s)-scale tubes 301. The electrode 304 is intended to serve as a common electrode that connects all materials inside of the tubes 303 and outside of the tubes 302. The interface between the nanometer(s)-scale tubes 301 and the electronic materials 302/303 form pn- or Schottky junctions, thus there are pn- or Schottky junctions on both sides, inside and outside, of the nanometer(s)-scale tubes 301.

According to this invention, alternatively the nanometer(s)-scale tubes 301 can be formed on the substrate (not shown here), and the electrode 304 can be made on the substrate to have a common contact for each nanometer(s)-scale rods or tubes 301, necessary for creating junction.

In way of an example not way of limitation, the nanometer(s)-scale tubes 301 can be made of metal and the electronic material 302 that surrounds the nanometer(s)-scale tubes 301 and the electronic material 303 that fills up the inside of the nanometer(s)-scale tubes 301 can be made of p-type semiconductor, thus a sandwich structure 302/301/303 forms two Schottky junctions on both sides of the metallic nanometer(s)-scale tubes 301. Incident light 305 enters the photovoltaic cell through either the electrode 304 or the electrode 300 (In FIG. 3, the incident light enters the photovoltaic cell through the electrode 300). As the incident light 305 travels through the electronic material 302 and 303, numerous numbers of electrons 306 and 307 (of electron-hole pairs) are generated. It should be pointed out that electrons (of electron-hole pairs) are apparently generated all over the region along the thickness of the nanometer(s)-scale tubes 301. Photo-generated electrons in the electronic material 302 and the electric materials 303 made of p-type semiconductor, then diffuse toward Schottky junctions in the sandwich structure 302/301/303. At the Schottky junctions, the diffused electrons are swept away by built-in potential, thus photovoltaic effects set in.

In addition to the common advantages already described for the photovoltaic cell in FIG. 2, since, in this invention, both inside and outside of the nanometer(s)-scale tubes 301 form junctions, the effective area that contributes to photovoltaic effects are roughly double the area provided by the cell in FIG. 2, thus the total electric power can be increased 50 times and beyond for a given cell size compared to conventional photovoltaic cells.

Figure 4:
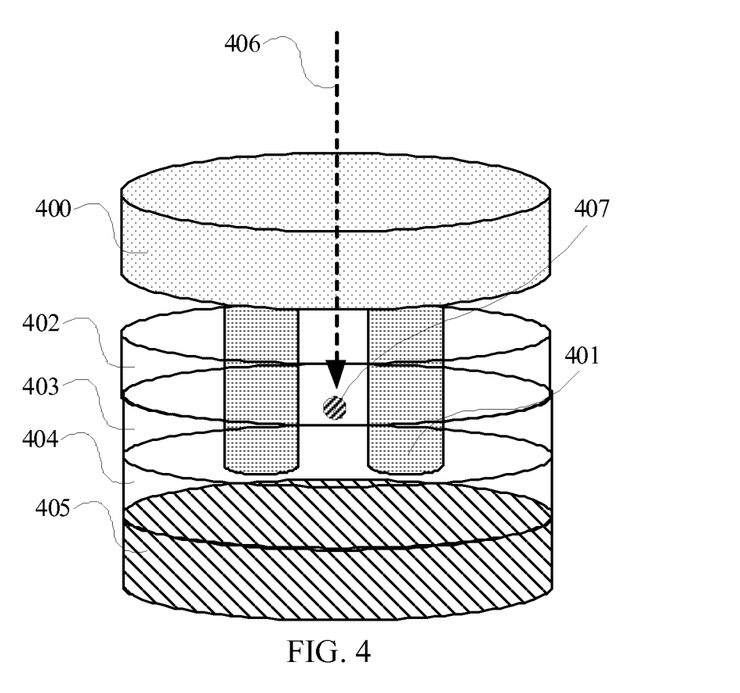
FIG. 4 is the schematic showing the cross-sectional view of a photovoltaic cell structure consisting of the nanometer(s)-scale wires, rods or tubes and multi-layered semiconductors, bandgaps of which are relates to the different spectrum of the solar spectrum, in the third embodiment in accordance to the present invention.

In an alternative preferred embodiment illustrated in FIG. 4, a photovoltaic cell comprises plurality of nanometer(s)-scale wires or rods 401 are electrically connected to an electrode 400. It is obvious for a person of ordinary skill in the art to recognize the following description applies to a photovoltaic cell comprises plurality of nanometer(s)-scale tubes, instead of wires or rods, as in FIG. 3. The nanometer(s)-scale wires or rods 401 can have metallic electrical conduction, p-type or n-type semiconductor electrical conduction. The nanometer(s)-scale wires or rods are further surrounded by multiple layers of different electronic materials 402~404 having metallic electrical conduction, p-type or n-type semiconductor electrical conduction. The number of layers shown in FIG. 4 is not the limitation, and it is apparent that the number of layers can be a wide range of numbers depending primarily on the thickness of each layer and the height of the nanometer(s)-scale wires or rods 401. The multiple layers can be dissimilar semiconductors having different bandgaps appropriately tuned to cover a wide range of spectrum of the light entering the cell as described later. The electronic material 404 is further electrically connected to an electrode 405. The electrode 400 has direct electrical contact to neither the electrical material 402 nor the electrode 405. The electrode 400 is intended to serve as a common electrode that connects all wires or rods 401. The electrode 405 is provided for the electronic material 404. The interface between the nanometer(s)-scale wires or rods 401 and the electronic material 402~404 form pn- or Schottky junctions where built-in potential for both electrons and holes is generated.

In way of an example not way of limitation, the nanometer(s)-scale wires or rods 401 can be made of n-type semiconductor and the electronic material 402~404 that surrounds the nanometer(s)-scale wires or rods 401 can be made of three different types of p-type semiconductors having different bandgaps. Incident light 406 that contains a broad-spectrum range enters the photovoltaic cell through either the electrode 405 or the electrode 400 (In FIG. 4, the incident light enters the photovoltaic cell through the electrode 400). As the incident light 406 travels through the electronic material 402~404, a specific spectrum range in the incident light 406 is absorbed in a specific layer in the multiple layers of electronic materials 402~404, in that, short, middle and long wavelengths in the incident light 406 can be absorbed subsequently in the layers 402, 403 and 404 respectively, then numerous number of electron 407 (and holes) are generated in each layers. Photo-generated electrons in the electronic material 402~404 made of p-type semiconductor (and vice versa for the holes (not shown here)), then diffuse toward the pn-junctions, created at the interface between the nanometer(s)-scale wires or rods 401 and the multi layered electronic material 402~404. At the pn-junctions, the electrons 407 are swept away by built-in potential, thus photovoltaic effects set in. Apparently, in addition to the common advantages already described in FIG. 2~FIG. 3 over conventional cells in FIG. 1, the additional advantage of the cell in FIG. 4 over the photovoltaic cells described in FIG. 2~FIG. 3 is to have a capability of covering a wide range of spectrum contained in incident light and converting a wide range of spectrum to photo generated carriers. Dozens of different layers could be stacked to catch photons at all energies, to make absorb wide band of solar spectrum, from lower wavelengths (as low as X-ray) to longer wavelength (e.g. long infrared). Addition of the multiple junction of different materials which could absorb wide solar spectrum plus the increasing of the junction area with using of the rod, wires, or tubes help to increase the electrical power energy 50 times and beyond as compared with the conventional solar cell of same size. According to this invention, dozens of materials, which could absorb wide solar spectrum, may or may not require the lattice mismatch with the rod, wires, or tubes. Lattice matched material could increase further increase of the power generation due to reduction of the recombination.

According to this invention, the rods, or wires could be GaN materials (n or p type) and the dozens of the materials could be $In_{1-x}Ga_xN$ (p or n type, opposite to GaN rods). With increasing of the Ga contents, the band-gap of InGaN can be increased to close to ~3.4 eV which is same as that of the GaN. With increasing of the In contents in InGaN, the band gap can be reduced to ~0.65 eV. Photons with less energy than the band gap slip right through. For example, red light photons are not absorbed by high-band-gap semiconductors. While photons with energy higher than the band gap are absorbed—for example, blue light photons in a low-band gap semiconductor—their excess energy is wasted as heat.

According to this invention, alternatively the rods, or wires could be III-V based materials (n or p type) for example InP and the dozens of the materials could be III-V based material for example $In_{1-x}Ga_xAs$ (p or n type, opposite to InP rods). In this case, with adjusting of In contents, band gap can be tuned and thereby the wide spectrum of the solar energy can be absorbed.

According to this invention, alternatively the rods, or wires could be II-V based materials (n or p type) for example CdTe and the dozens of the materials could be II-VI based material for example CdZnS (p or n type, opposite to CdTe rods). In this case, with adjusting of Zn contents, band gap can be tuned and thereby the wide spectrum of the solar energy can be absorbed.

According to this invention, alternatively the rods, or wires could be Si (or amorphous Silicon materials (n or p type) and the dozens of the materials could be Si: Ge alloy (p or n type, opposite to Si rods). In this case, with adjusting of Ge contents, band gap can be tuned and thereby the wide spectrum of the solar energy can be absorbed.

According to this invention, alternatively the rods, or wires could be Si, InP, or CdTe (n or p type) and the dozens of the materials, could be different material which could make the junction with the rods (wires or tubes) and each type of material has the specific band gap for absorbing the specific range of solar spectrum. In this way also wide range of solar spectrum can be absorbed, and with increasing of the junction area (due to use of the rods, wires, or tubes), the electrical power generation could be increased tremendously 50 times and beyond.

According to this invention, alternatively the nanometer(s)-scale rods 401 can be formed on the substrate (not shown here), and the electrode 405 can be made on the substrate to have a common contact for each nanometer(s)-scale rods or tubes 401, necessary for creating junction.

According to this invention, alternatively the nanometer(s)-scale tubes (not shown here) can be formed instead of nanometer(s)-scale rods 401 and furthermore those nanometer(s)-scale tubes can be either empty or filled up with an electronic material having metallic electrical conduction, p-type or s-type semiconductor electrical conduction.

Figure 5:
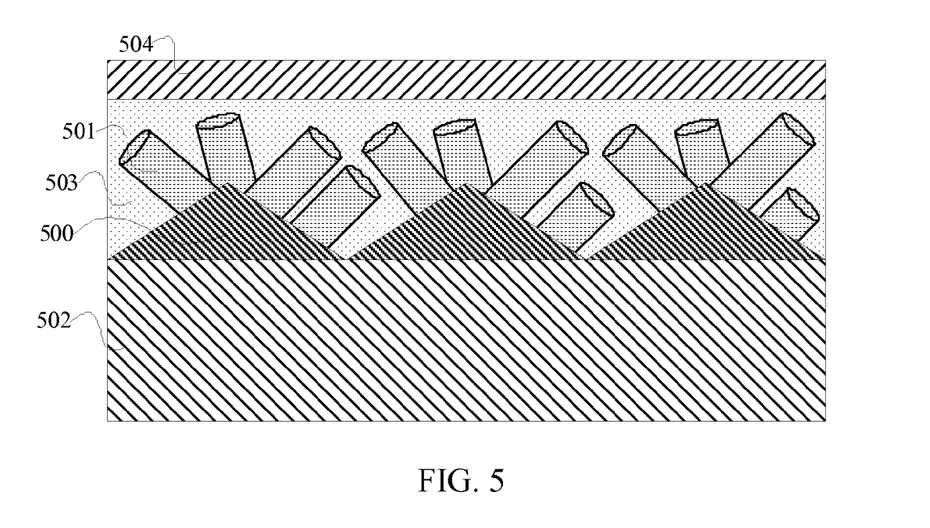
FIG. 5 is the schematic showing the cross-sectional view of a photovoltaic cell structure consisting of the nanometer(s)-scale wires, rods or tubes, formed on pyramid or triangular shaped surface to achieve large junction area, in the fourth embodiment in accordance to the present invention.

In another preferred embodiment shown in FIG. 5, plurality of photovoltaic cells comprising plurality of nanometer(s)-scale wires or rods 501 are randomly and electrically connected to an electrode that has arbitrary shapes 500 (In FIG. 5, triangular shape is illustrated, however any arbitrary shapes can be applicable here) further connected an electrode 502. It is obvious for a person of ordinary skill in the art to recognize the following description applies to a photovoltaic cell comprises plurality of nanometer(s)-scale tubes, instead of wires or rods, as in FIG. 3. The nanometer(s)-scale wires or rods 501 can have metallic electrical conduction, p-type or n-type semiconductor electrical conduction. The nanometer(s)-scale wires or rods are further surrounded by an electronic material 503 having metallic electrical conduction, p-type or n-type semiconductor electrical conduction. The electronic material 503 is further electrically connected to an electrode 504. The electrodes 500 and 502 have direct electrical contact to neither the electrical material 503 nor the electrode 504. The interface between the nanometer(s)-scale wires or rods 501 and the electronic material 502 form pn- or Schottky junctions where built-in potential for both electrons and holes is generated. The way this photovoltaic cell operates is just the same way in other photovoltaic cells illustrated in FIG. 2~FIG. 4, therefore, the unique characteristics for this photovoltaic cell in FIG. 5 is the fact that the nanometer(s)-scale wires, rods or tubes, are connected to electrodes that can have, instead of planar surface, three-dimensionally arbitrary shape. This structure helps to increase the effective junction area and PCCE is expected to be much higher than in photovoltaic cells described in FIGS. 2 to 4.

Figure 6A:
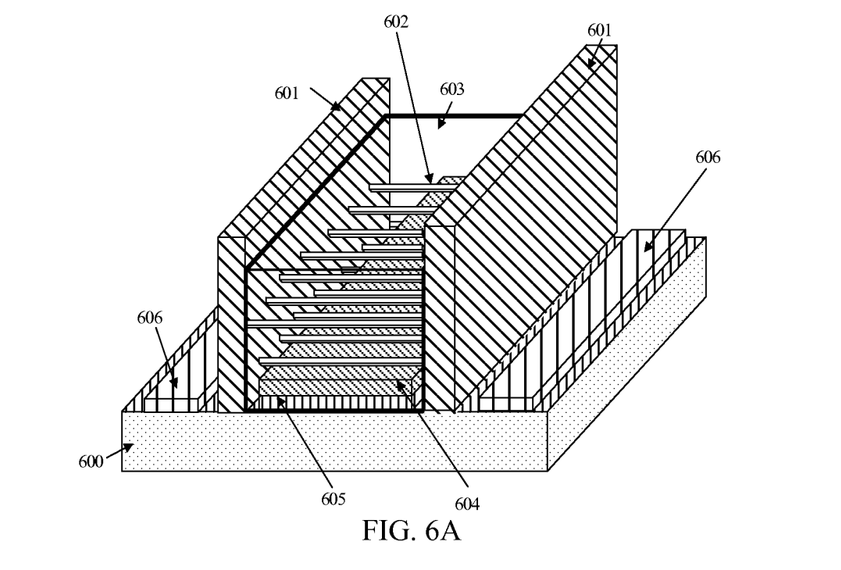
FIGS. 6A and 6B are the schematic showing the side-view and cross-sectional views of a photovoltaic cell structure consisting of the nanometer(s)-scale wires, rods or tubes, arranged horizontally, parallel to the substrate to achieve large junction area, in the fifth embodiment in accordance to the present invention.
Figure 6B:
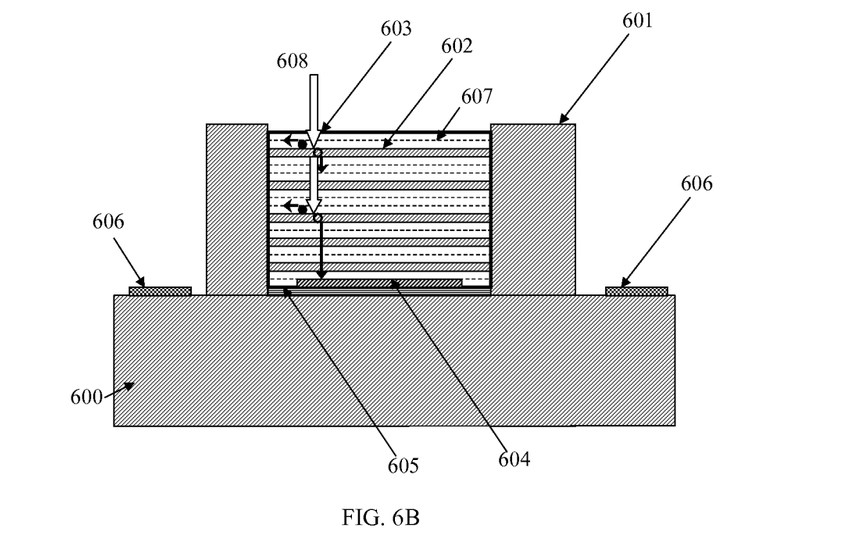

FIGS. 6A and 6B, another preferred embodiment, are schematics showing the side and cross-sectional view of a photovoltaic cell structure consisting of nanometer(s)-scale wires, rods or tubes, arranged horizontally, parallel to a substrate to achieve large junction area with respect to the incident light entering the cell perpendicular to the substrate surface. As in FIG. 6A, a substrate 600 that has metallic, or n-type or p-type semiconductor electrical conduction, has plurality of vertical walls 601 made of a material that has metallic, or n-type or p-type semiconductor electrical conduction. Electrodes 606 are provided to the substrate 600 for electrical connection to the photovoltaic cell. Metal or semiconductor nanometer(s)-scale wires or rods 602 are formed perpendicular to the vertical walls 601, bridging two adjacent vertical walls 601. It should be noted that the metallic or semiconductor wires, rods or tubes 602 could also be tubes rather than wires or rods. The nanometer(s)-scale rods 602 can be made of either a similar or a dissimilar material to that of the vertical walls 601. The nanometer(s)-scale wires or rods 602 are further surrounded by an electronic material 603 made of a semiconductor material. The electronic material 603 is electrically connected to an electrode 604, however the electrode 604 is electrically isolated from the substrate 600 by an insulator 605 and from the vertical walls 601.

In way of an example not way of limitation, in FIG. 6B, the nanometer(s)-scale rods 602 can be made of n-type semiconductor and the electronic material 603 that surrounds the nanometer(s)-scale wires or rods 602 can be made of p-type semiconductors, thus forming large area pn-junction 607 at the interface between the nanometer(s)-scale wires or rods 602 and the electronic material 603. As the incident light 608 enters the cell, carriers are generated both in the nanometer(s)-scale rods 602 and the electronic material 603, diffusing into the pn-junction 607 and contributing to photovoltaic effects.

According to this invention, the surrounding material 603 can be single or plurality layers of materials having different band gaps, which correspond to the different absorption wavelength, contained in the incident light, as described in FIG. 4.

Figure 7:
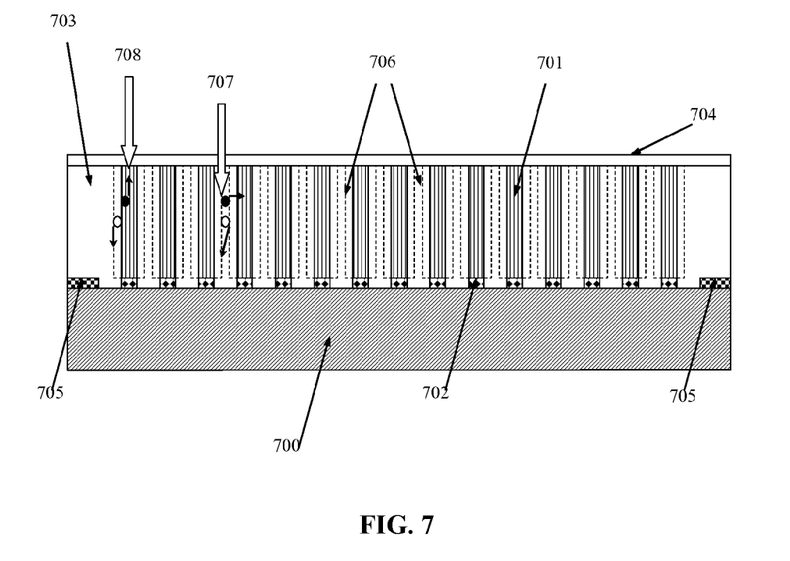
FIG. 7 is the schematic showing the cross-sectional view of a photovoltaic cell structure consisting of the nanometer(s)-scale wires, rods or tubes formed on the semiconductor/insulator self-assembled dots or islands, arranged vertically to the substrate to achieve large junction area, in the sixth embodiment in accordance to the present invention.

FIG. 7, another preferred embodiment, is a schematic showing the cross-sectional view of a photovoltaic cell structure consisting of plurality of nanometer(s)-scale wires, rods or tubes 701 formed on semiconductor/insulator self-assembled dots or islands 702, arranged vertically to a substrate 700. The nanometer(s)-scale wires, rods or tubes 701 can be The nanometer(s)-scale wires, rods or tubes can be made of a variety of electronic materials such as metals and semiconductors (Elemental semiconductors such as Si, Ge and C and compound semiconductors). 701 can also be directly formed on the electronic material substrate 700 (not shown here). In the case of nanometer(s)-scale tubes, the tubes can be empty or filled up by the electronic materials (not shown here), as described in FIG. 3. The nanometer(s)-scale wires, rods or tubes 701 are further connected to an electrode 704. The nanometer(s)-scale wires, rods or tubes 701 are also surrounded by a semiconductor 703 for which electrode 705 are provided.

In way of an example not way of limitation, in FIG. 7, the nanometer(s)-scale wires, rods or tubes 701 can be made of n-type semiconductor and the electronic material 703 that surrounds the nanometer(s)-scale wires, rods or tubes 701 can be made of p-type semiconductors, thus forming large area pn-junction 706 at the interface between the nanometer(s)-scale rods 701 and the electronic material 703. As the incident light 707 and 708 enter the cell, carriers are generated both in the electronic material 703 and the nanometer(s)-scale wires, rods or tubes 701, diffusing into the pn-junction 706 and contributing to photovoltaic effects.

Figure 8:
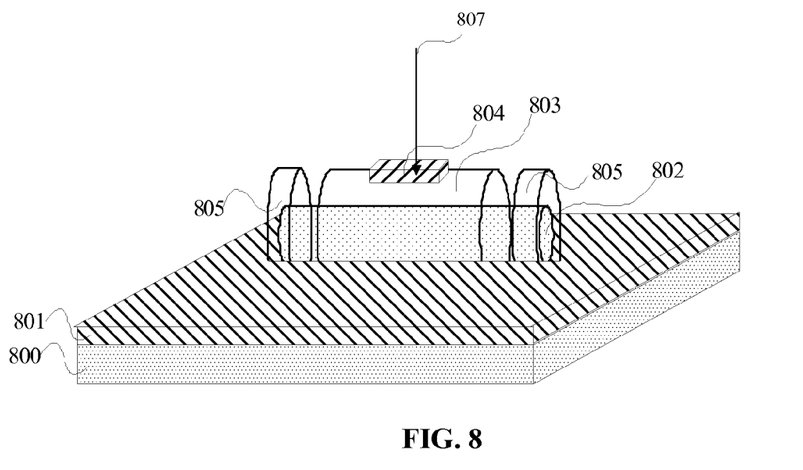
FIG. 8 is the schematic showing the side-view of a photovoltaic cell structure consisting of the nanometer(s)-scale wires, rods or tubes, in the seventh embodiment in accordance to the present invention.

In another preferred embodiment, FIG. 8 illustrates a side view of a photovoltaic cell comprising of nanometer(s)-scale wires, rods or tubes, arranged horizontally, parallel to a substrate to achieve large junction area with respect to the incident light entering the cell along the surface normal of the substrate 800. As in FIG. 8, a substrate 800 that has metallic, or n-type or p-type semiconductor electrical conduction, is covered with an electrical insulation layer 801. Pluralities of nanometer(s)-scale tubes 802 are formed horizontally on the insulating layer 801. The nanometer(s)-scale tubes 802 are further surrounded by an electronic material 803 that has metallic, or n-type or p-type semiconductor electrical conduction. An electrode 804 is provided on the electronic material 803. The both ends of the plurality of nanometer(s)-scale tubes 802 are connected to electrodes 805, thus the plurality of nanometer(s)-scale tubes 802 are electrically accessible from the electrodes 805, and the interface between the plurality of nanometer(s)-scale tubes 802 and the electronic material 803 forms either pn-junction of Schottky junctions.

In way of an example not way of limitation, the nanometer(s)-scale tubes made of carbon atoms 802 that have metallic electrical conduction can be surrounded by the electronic material 803 made of p-type semiconductors, thus forming Schottky-junction at the interface between the nanometer(s)-scale tubes 802 and the electronic material 803. As the incident light 807 enters the cell, electrons are generated in the electronic material 803, and then the photo-generated electrons diffusing into the Schottky-junction contribute to photovoltaic effects.

According to this invention, the nanometer(s)-scale wires, rods or tubes, mentioned in the preferred embodiments, can be any kinds of electronics materials covering semiconductor, insulator or metal.

According to this invention, the nanometer sized rods, wire or tubes can be made from the semiconductors such as Si, Ge, or compound semiconductors from III-V or II-VI groups. As an example for rods, wire, or tubes, InP, GaAs, or GaN III-V compound semiconductor can be used and they can be made using standard growth process for example, MOCVD, MBE, or standard epitaxial growth. According to this invention, the self-assembled process can also be used to make wires, rods, or tubes and their related pn-junction to increase the junction area. These rods, wire, or tubes can be grown on the semiconductors (under same group or others), polymers, or insulator. Alternatively, according to this invention, these rods, wire, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can cover also all kinds of polymers or ceramics such as AlN, Silicon-oxide etc.

According to this invention, the nanometer sized rods, wire or tubes based on II-VI compound semiconductor can also be used. As an example CdTe, CdS, Cdse, ZnS, or ZnSe can also be used, and they can be made using standard growth process for example, sputtering, evaporation, MOCVD, MBE, or standard epitaxial growth. According to this invention, the self-assembled process can also be used to make wire, rods, or tubes and their related pn-junction to increase the junction area. These rods, wire, or tubes can be grown on the semiconductors (under same group or others), polymers, or insulator. Alternatively, according to this invention, these rods, wire, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can cover also all kinds of polymers or ceramics such as AlN, Silicon-oxide etc.

According to this invention, the nanometer sized rods, wire or tubes can be made from the carbon type materials (semiconductor, insulators, or metal like performances) such as carbon nano-tubes, which could be single, or multiple layered. They can be made using standard growth process for example, MOCVD, MBE, or standard epitaxial growth. According to this invention, the self-assembled process can also be used to make wires, rods, or tubes and their related pn-junction to increase the junction area. These tubes can be grown on the semiconductors (under same group or others), polymers, or insulator. Alternatively, according to this invention, these rods, wire, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can cover also all kinds of polymers or ceramics such as AlN, Silicon-oxide etc.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope. Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

The present invention is expected to be found practically use in the novel photo-voltaic cells which as higher power generation capability (25 times and beyond) as compared with that of the conventional cells. The proposed invention can be used for fabricating wide solar panel for both commercial and space applications.

What is claimed is:

1. A photovoltaic cell comprising:
    a substrate
    an insulator layer overlaying one surface of the substrate;
    one or more nanometer-scale wires or rods having two ends, disposed horizontally on the insulator layer such that the nanometer scale wires or rods are substantially parallel to the substrate;
    at least one layer of electronic material surrounding the one or more nanometer-scale wires or rods, said at least one layer of electronic material partially embedding said one or more nanometer-scale wires or rods and exhibiting semiconductor electrical conduction characteristics;
    a first electrode electrically connected to said at least one layer of electronic material; and
    a second electrode electrically connected to said one or more nanometer-scale wires or rods,
    wherein junctions providing built-in electric field are formed at interfaces between the one or more nanometer-scale wires or rods and the at least one layer of electronic material surrounding the nanometer-scale wires or rods, and
    wherein the junctions are p-n junctions or Schottky junctions.

2. The photovoltaic cell of claim 1, wherein the one or more nanometer-scale wires or rods are selected from a group consisting of metallic, semiconductor, and carbon-like material.

3. The photovoltaic cell of claim 1, wherein the one or more nanometer-scale wires or rods comprise more than one type of material.

4. The photovoltaic cell of claim 1, wherein
    the one or more nanometer-scale wires or rods are composed of CdTe;
    the at least one layer of electronic material is composed of CdS; and
    the second electrode is composed of a metal suitable to form ohmic contact with CdTe.

5. The photovoltaic cell of claim 1, wherein said second electrode further comprises:
    a first section of electrode; and
    a second section of electrode,
    wherein the first section of electrode connects to one end of said one or more nanometer-scale wires or rods, and the second section of electrode connects other end of said nanometer scale wires or rods,
    wherein the first section of electrode and the second section of electrode are electrically connected to make the second electrode, and
    wherein the second electrode is electrically isolated from said at least one layer of electronic material.

6. The photovoltaic cell of claim 1,
    wherein the first electrode is composed of a transparent conductive metal,
    the one or more nanometer scale wires or rods are composed of GaN of n or p-type,
    and the at least one layer of electronic material is p or n-type $In_{1-x}Ga_xN$ such that doping polarity is opposite type from that in the one or more nanometer-scale wires or rods,
    wherein for each of the at least one layer of electronic material, x is varied according to $0 \leq x \leq 1$, such that a layer nearest to a surface receiving the incident electromagnetic radiation has high Ga contents resulting in a high band gap material, and a layer farthest from said surface has low Ga content resulting in a low band gap material.

7. The photovoltaic cell of claim 1, wherein
the first electrode is composed of a transparent conductive metal,
the one or more nanometer-scale wires or rods are composed of InP of n or p-type,
and the at least one layer of electronic material is p or n-type $In_{1-x}Ga_xAs$ such that doping polarity is opposite type from that in the one or more nanometer-scale wires or rods,
wherein for each of the at least one layer of electronic material, x is varied according to $0 \le x \le 1$, such that a layer nearest to a surface receiving the incident electromagnetic radiation has high Ga contents resulting in a high band gap material, and a layer farthest from said surface has low Ga content resulting in a low band gap material.

8. A photovoltaic cell comprising:
a substrate;
an insulator layer;
one or more nanometer-scale tubes having two ends, disposed horizontally on the insulator layer such that the one or more nanometer-scale tubes are substantially parallel to the substrate;
at least one layer of first electronic material surrounding the one or more nanometer-scale tubes, the at least one layer of first electronic material partially embedding the one or more nanometer-scale tubes, such that said one or more nanometer-scale tubes have both ends extending out from the at least one layer of first electronic material;
a first electrode electrically connected to the at least one layer of first electronic material; and
a second electrode electrically connected to said one more nanometer-scale tubes,
wherein junctions providing built-in electric field are formed at interfaces between the one or more nanometer-scale tubes and the at least one layer of first electronic material surrounding the one or more nanometer-scale tubes, and
wherein the junctions are ones selected from the group consisting of p-n junctions and Schottky junctions.

9. The photovoltaic cell of claim 8, wherein the one or more nanometer-scale tubes are the ones selected from a group consisting of metal, semiconductor, or carbon-type material.

10. The photovoltaic cell of claim 8, wherein:
the one or more nanometer-scale tubes are composed of CdTe;
the at least one layer of first electronic material is composed of CdS; and
the second electrode is composed of a metal suitable to form ohmic contact with CdTe.

11. The photovoltaic cell of claim 8, wherein the one or more nanometer-scale tubes further comprise:
a second electronic material inside the one or more nanometer-scale tubes, the second electronic material being in electrical contact with the first electrode and the at least one layer of first electronic material,
wherein additional junctions are formed at the interfaces between the one or more nanometer-scale tubes and second electronic material provide additional electrical built-in-potential, and
wherein the additional junctions are p-n junctions or Schottky junctions.

12. The photovoltaic cell of claim 11, wherein the second electronic material is selected from a group consisting of semiconductor and metal.

13. The photovoltaic cell of claim 12, wherein the one or more nanometer-scale tubes are p-type or n-type, the second electronic material is opposite type to said one or more nanometer-scale tubes, and the first electronic material is opposite type to said one or more nanometer-scale tubes, such that said junctions and said additional junctions are p-n junctions.

14. The photovoltaic cell of claim 8, wherein said second electrode further comprises:
a first section of electrode; and
a second section of electrode,
wherein the first section of electrode connects to one end of said one or more nanometer-scale tubes, and the second section of electrode connects other end of said one or more nanometer scale tubes,
wherein the first section of electrode and the second section of electrode are electrically connected to make the second electrode, and
wherein the second electrodes are not electrically connected to said at least one layer of electronic material.

15. The photovoltaic cell of claim 8, wherein each layer of the at least one layer of first electronic material is comprised of different materials or different doping configurations such that electromagnetic radiations of different wavelengths are absorbed.

16. A photovoltaic cell comprising:
a substrate
an insulator layer overlaying one surface of the substrate;
one or more nanometer-scale three dimensional geometric structures having two ends, selected from a group consisting of tubes, wires, and rods, disposed horizontally on the insulator layer such that the one or more nanometer-scale three dimensional geometric structures are substantially parallel to the substrate;
at least one layer of electronic material surrounding the one or more nanometer-scale three dimensional geometric structures, said at least one layer of electronic material partially embedding the one or more nanometer-scale three dimensional geometric structures, such that said one or more nanometer-scale three dimensional geometric structures have both ends extending out from said at least one layer of electronic material;
a first electrode electrically connected to said at least one layer of electronic material; and
a second electrode electrically connected to the one or more nanometer-scale three dimensional geometric structures,
wherein junctions providing built-in electric field are formed at interfaces between the one or more nanometer-scale three dimensional geometric structures and the at least one layer of electronic material surrounding the one or more nanometer-scale three dimensional geometric structures,
wherein the junctions are p-n junctions or Schottky junctions, and
wherein material type of the one or more nanometer-scale three dimensional geometric structures is one, selected from a group consisting of material exhibiting carbon like, metallic, n-type semiconductor, and p-type semiconductor electrical conduction characteristics.

17. The photovoltaic cell of claim 16, wherein there are a plurality of layers of electronic material, which comprise different electronic materials or similar electronic materials having different material contents, such that variation in absorption characteristics in said plurality of layers of electronic material arc ensured to achieve absorption of electromagnetic radiation over a wide wavelength range.

18. The photovoltaic cell of claim 16, wherein
the first electrode is composed of a transparent conductive metal,
the one or more nanometer-scale three dimensional geometric structures are composed of GaN of n or p-type,
the at least one layer of electronic material is p or n-type $In_{1-x}Ga_xN$ such that doping polarity is opposite kind from that in the one or more nanometer-scale three dimensional geometric structures,
wherein for each of the at least one layer of electronic material, x is varied according to $0 \leq x \leq 1$, such that a layer nearest to a surface receiving the incident electromagnetic radiation has high Ga contents resulting in a high band gap material, and a layer farthest from said surface has low Ga content resulting in a low band gap material.

19. The photovoltaic cell of claim 16, wherein:
the first electrode is composed of a transparent conductive metal;
the one or more nanometer-scale three dimensional geometric structures are composed of CdTe of n or p-type, the at least one layer of electronic material is p or n-type $Cd_{1-x}Zn_xS$ such that doping polarity is opposite kind from that in the one or more nanometer-scale three dimensional geometric structures; and
the second electrode is composed of a metal suitable to construct an ohmic contact to CdTe,
wherein for each of the at least one layer of electronic material, x is varied according to $0 \leq x \leq 1$, such that a layer nearest to a surface receiving the incident electromagnetic radiation has high Zn contents resulting in a high band gap material, and a layer farthest from said surface has low Zn content resulting in a low band gap material.

20. The photovoltaic cell of claim 16, wherein:
the first electrode is composed of a transparent conductive metal;
the one or more nanometer-scale three dimensional geometric structures are composed of Si of n or p-type, the at least one layer of electronic material is p or n-type Si:Ge alloy, such that doping polarity is opposite kind from that in the one or more nanometer-scale three dimensional geometric structures; and
the second electrode is composed of a metal suitable to construct an ohmic contact to Si,
wherein for each of the at least one layer of electronic material, Ge is varied, such that a layer nearest to a surface receiving the incident electromagnetic radiation has low Ge contents resulting in a high band gap material, and a layer farthest from said surface has high Ge content resulting in a low band gap material.

* * * * *